US 6,541,394 B1

(12) United States Patent
Chen et al.

(10) Patent No.: US 6,541,394 B1
(45) Date of Patent: Apr. 1, 2003

(54) METHOD OF MAKING A GRADED GROWN, HIGH QUALITY OXIDE LAYER FOR A SEMICONDUCTOR DEVICE

(75) Inventors: Yuanning Chen; Sailesh Mansinh Merchant; Pradip Kumar Roy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 97 days.

(21) Appl. No.: 09/481,992

(22) Filed: Jan. 11, 2000

Related U.S. Application Data (60) Provisional application No. 60/140,666, filed on Jun. 24, 1999, provisional application No. 60/140,909, filed on Jun. 24, 1999, and provisional application No. 60/115,717, filed on Jan. 12, 1999.

(51) Int. Cl.$^7$ ............................................... H01L 21/31
(52) U.S. Cl. ...................... 438/770; 438/769; 438/787; 438/791
(58) Field of Search ................................ 438/770, 787, 438/790, 769

(56) References Cited

U.S. PATENT DOCUMENTS

| | | | | |
|---|---|---|---|---|
| 5,707,888 A | * | 1/1998 | Aronowitz et al. | 437/69 |
| 5,739,580 A | * | 4/1998 | Aronowitz et al. | 257/647 |
| 5,851,892 A | | 12/1998 | Lojek et al. | 439/305 |
| 5,869,405 A | | 2/1999 | Gonzales et al. | 438/770 |
| 5,885,870 A | * | 3/1999 | Maiti et al. | 438/261 |
| 5,891,809 A | * | 4/1999 | Chau et al. | 438/770 |
| 5,926,741 A | * | 7/1999 | Matsuoka et al. | 438/778 |

OTHER PUBLICATIONS

"Characterization Of Stacked Gate Oxides By Electron Holography," W. D. Rau et al., Applied Physics Letters 68 (24), Jun. 10, 1996.
European Standard Search Report, dated May 23, 2000.*
"Improvement Of Gate Dielectric Reliability for p–Poly MOS Devices Using Remote PECVD Top Nitride Deposition On Thin Gate Oxides," Wu et al., in the IEEE Annual International Reliability Physics Symposium, Reno, Nevada, 1998, pp. 70–75.

* cited by examiner

Primary Examiner—Alexander G. Ghyka
(74) Attorney, Agent, or Firm—William S. Francos; Anthony Grillo (57) ABSTRACT

A method for making an oxide layer on a silicon substrate produces an oxide layer including graded portions with greatly reduced stress. The method includes growing a first oxide portion over a substrate by upwardly ramping the substrate to a first temperature lower than a $SiO_2$ viscoelastic temperature. Thereafter a second oxide portion is grown between the first oxide portion and the silicon substrate by exposing the silicon substrate to an oxidizing ambient at a second temperature higher than the $SiO_2$ viscoelastic temperature. The second oxide portion may have a thickness in a range of about 25 to 50% of a total thickness of the graded oxide layer.

33 Claims, 7 Drawing Sheets

METHOD OF MAKING A GRADED GROWN, HIGH QUALITY OXIDE LAYER FOR A SEMICONDUCTOR DEVICE

CROSS REFERENCE TO RELATED APPLICATION

This application claims priority from U.S. Provisional Application Ser. No. 60/115,717 which was filed on Jan. 12, 1999; U.S. Provisional Application Ser. No. 60/140,666 which was filed on Jun. 24, 1999; and from U.S. Provisional Application Ser. No. 60/140,909 which was filed on Jun. 24, 1999.

FIELD OF THE INVENTION

The present invention relates to the field of semiconductor processing, and, more particularly, to a method for making a high quality oxide for a semiconductor device.

BACKGROUND OF THE INVENTION

Semiconductor devices in the form of integrated circuits are widely used in most electronic devices. For example, computers, cellular telephones, and other similar devices typically include one or more integrated circuits (ICs). In addition, many typical types of ICs are based upon metal-oxide semiconductor (MOS) technology wherein each transistor includes doped source and drain regions in a semiconductor substrate, with a channel region between the drain and source. An oxide layer also referred to as the gate oxide layer is a thin insulating layer of silicon oxide formed over the channel region and which separates the channel region from an overlying conductive gate. The gate may be a metal or doped polysilicon layer, for example.

As device dimensions have been reduced in semiconductor processing, the quality of the gate oxide has become even more important. One technique used to fabricate the gate oxide is thermal oxidation. The thermally grown oxide provides good electrical performance, provides improved mechanical bonding to the underlying silicon substrate, and helps to block ion implantation and diffusion of dopants into the channel region.

There have been considerable efforts directed to forming high quality oxides for semiconductor devices. For example, an article entitled "Improvement of Gate Dielectric Reliability for p+ Poly MOS Devices Using Remote PECVD Top Nitride Deposition on Thin Gate Oxides" by Wu et al. in the IEEE 36th Annual International Reliability Physics Symposium, Reno Nev. 1998, pp. 70–75, discloses a dual layer dielectric including a nitride portion on a thin thermally grown oxide. The introduction of nitrogen atoms into the gate dielectric may suppress diffusion of boron atoms from heavily doped p+ polycrystalline silicon gate electrodes, and reduce defect generation under either Fowler-Nordheim stressing or hot carrier stressing. Along these lines, U.S. Pat. No. 5,891,809 to Chau et al. discloses a method for forming a nitrided oxide layer wherein a substrate is oxidized in a chlorinated dry oxidation ambient followed by a low temperature pyrogenic steam oxidation. A low temperature ammonia anneal is performed, followed by a high temperature anneal in an inert ambient.

U.S. Pat. No. 5,869,405 to Gonzalez et al. discloses in situ rapid thermal etching and oxidation to form an oxide. In particular, an oxidation step is followed by an etch step to remove contamination and damage from the substrate. Repeated in situ oxidation and etch steps may be used until a desired removal of contamination or silicon damage is achieved.

U.S. Pat. No. 5,81,892 to Lojek et al. discloses a method for making an oxide including both pre- and post-oxidation anneal steps. The patent provides that the anneals, the ambients selected, and various cleaning steps help ensure a high quality gate or tunnel oxide. A portion of the oxide layer grown during the high temperature (1000° C.) anneal and subsequent cool down is desirably reduced to less than about 20 Å, and its growth is the necessary byproduct of incorporating oxygen into the oxide bulk for the benefit of improving electrical performance. The oxide layer is described as having an overall thickness of 100 Å.

Silicon dioxide is not a good diffusion barrier for gate electrode dopants, such as boron. Even with nitrogen incorporation, ultrathin nitrided oxides cannot be used for sub-0.25 μm technologies due to a high tunneling current and a rough $Si/SiO_2$ interface. Recent predictions of the end of gate-oxide scaling have got the industry's undivided attention. This has led to an intensive search for alternative gate dielectrics, such as $Ta_2O_5$, that have the potential to significantly ameliorate this problem. However, these materials suffer from unacceptable levels of interface traps ($D_{it}$), bulk fixed charge ($Q_f$), low interface carrier mobility and phase stability issues. Hence, a significant silicon-dielectric interface engineering is needed before high dielectric constant (high-k) can be used as gate material in complementary metal-oxide-semiconductor (CMOS) technologies. It is widely accepted that there are very significant challenges in both the materials science and the process architecture before an alternative dielectric can be used commercially. At this point the industry is directing a concerted effort at the extension of $SiO_2$ for as long as possible.

The Semiconductor Industry Association (SIA) has recently published its latest roadmap, which presents projections of the expected device and manufacturing process requirements covering the next 15 years. The MOS-style transistor is expected to continue to provide the most important electronic element for the near future, but the end of the ability to scale down devices using conventional MOS technology is approaching. Several key device fabrication methods will not be applicable when device dimensions shrink below 0.1 m. Lithography for features 0.1 μm poses a serious economic problem, but a more fundamental problem arises when the gate oxide thickness drops below about 25 Å, because of the large leakage currents associated with direct tunneling through such a thin oxide.

Aggressive scaling of oxide thickness for future CMOS logic requires, among other concerns, an assurance that the oxide can meet requirements for reliability. When an electron current is established across the gate dielectric ($SiO_2$) of a MOS capacitor or transistor, defects such as electron traps, interface states, positively charged donor-like states, etc., adversely impact the oxide until a point where the oxide suddenly and destructively breaks down. The exponentially increasing tunnel current with decreasing oxide thickness will cause the time-to-breakdown to decrease if the gate voltage is not simultaneously reduced sufficiently.

The rate of defect generation by electrical stress in silicon dioxide has been measured as a function of gate voltage down to 2 V on a variety of MOSFETs with oxide thickness in a range of 1.4 to 5 nm. The critical defect density necessary for destructive breakdown has also been measured in this thickness range. These quantities are used to predict time to breakdown for ultrathin oxides at low voltages. The properties of the break-down distribution, which becomes broader as the oxide thickness is reduced, are used to provide reliability projections for the total gate area on a chip. It has been predicted that oxide reliability may limit oxide scaling to about 2.6 nm (CV extrapolated thickness) of 2.2 nm (QM thickness) for a 1 V supply voltage at room temperature and the current SIA roadmap will be unattainable for reliability reasons by sometime early next century.

Unfortunately, despite continuing efforts and developments in the area of forming high quality oxides, device performance and longer term reliability is still compromised by conventional gate oxides, especially as device dimensions continue to be reduced.

What is needed, therefore is a method for making a high quality oxide layer for a semiconductor device that overcomes the shortcomings of conventional oxide fabrication techniques.

SUMMARY OF THE INVENTION

The present invention is drawn to a method for making a graded oxide layer by growing a first oxide portion on a substrate by upwardly ramping the substrate to a first temperature lower than the $SiO_2$ viscoelastic temperature (also referred to as the glass transition temperature), and exposing the silicon substrate to an oxidizing ambient at the first temperature and for a first time period. Modulated heating and cooling segments of the process are employed and are thought to reduce the stress of the oxide of the present invention. A second oxide portion is then grown between the first oxide portion and the substrate by exposing the silicon substrate to an oxidizing ambient at a second temperature higher than the $SiO_2$ viscoelastic temperature for a second time period. In one embodiment the first and second oxide portions are grown so that the second oxide portion has a thickness in a range of about 25 to 50% of a total thickness of the graded oxide layer.

The method produces an oxide layer having graded portions with greatly reduced stress, and substantially higher reliability, among other desirable properties. The ratio of the relative thicknesses of the first and second portions can be controlled to produce an ultrathin oxide layer, for example, with the advantageous properties discussed above.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Referring initially to FIGS. 1 through 5 the high quality oxide layer 30 in accordance with the present invention is first described. The oxide layer 30 can be incorporated into a MOS transistor 21 which, in turn, is part of an integrated circuit 20 as will be readily appreciated by those skilled in the art. The MOS transistor 21 includes a source region 23 and a drain region 24 separated by a channel region 25. Of course, the source and drain regions 23, 24 may be formed in the substrate 22 by conventional fabrication techniques which require no further discussion herein. The substrate 22 is preferably silicon. It may be monocrystalline or polycrystalline silicon. Generally, it is oxidizable silicon.

Figure 1:
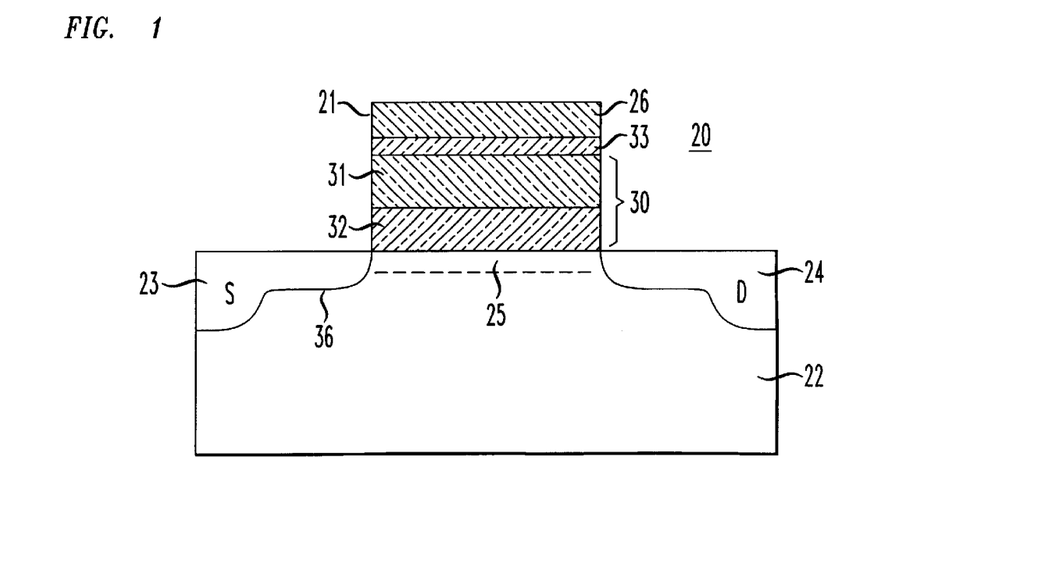
FIG. 1 is a schematic cross-sectional view of portion of an integrated circuit illustrating a MOS transistor including a gate oxide in accordance with the present invention.

Overlying the channel region is the oxide layer 30 in accordance with the invention. The oxide layer 30 is between the conductive gate 26 and the channel region 25. The oxide layer 30 includes a first portion 31 and a second portion 32 arranged in stacked relation. The oxide layer 30 may have a layer of suitable dielectric 33 disposed between it and the conductive gate 26. This layer 33 may be a high-k dielectric such as $Ta_2O_5$, for example, but other high-k materials known to one skilled in the art may be used. The oxide layer 30 provides the desired electrical characteristics in terms of a low interface trap site density, resistance to hot carrier aging, and improved time dependent dielectric breakdown (TDDB), for example.

The wear out behavior is 5 to 15 times longer than for conventional oxides. The TDDB for an oxide of the present invention having a thickness of about 50 A, for example, subject to an accelerated stress test of a 2.5 to 7.5 Megavolt field at 150 C provides a 50% failure rate equivalent to 25 years of normal operation. For a conventional oxide, the TDDB would likely be in the range of about 1–10 years. Accordingly, the present invention overcomes the doomsday prediction of others relating to the downward scaling of the oxide layers as device dimensions continued to be reduced.

One method for making a graded oxide layer 30 includes the steps of: growing a first oxide portion 31 by upwardly ramping the silicon substrate 22 to a first temperature lower than a SiO$_2$ viscoelastic temperature, and exposing the silicon substrate to an oxidizing ambient at the first temperature and for a first time period; and growing a second oxide portion 32 between the first oxide portion and the silicon substrate by exposing the silicon substrate to an oxidizing ambient at a second temperature higher than the SiO$_2$ viscoelastic temperature for a second time period. In one embodiment the first and second oxide portions are grown so that the second oxide portion 32 has a thickness in a range of 25 to 50% of a total thickness of the graded oxide layer 30. The oxidizing ambient, for example. In other embodiments, a wet oxidizing ambient may be used as will also be appreciated by those skilled in the art.

Figure 5:
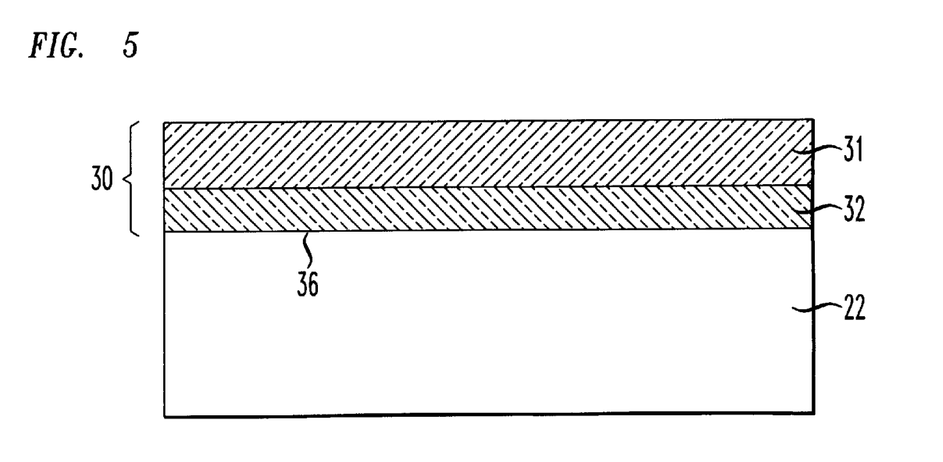

The method produces an oxide layer 30 having first and second graded portions 31, 32 with greatly reduced stress in the area adjacent the interface between the substrate 22 and the oxide layer, and substantially higher reliability. The layer 33, if desired, may be deposited over the layer 30 after the fabrication of layer 30.

One aspect of the invention relates to the step of upwardly ramping the temperature at a relatively high ramping rate to reduce any oxide formed during the upward ramping. For example, the relatively high ramping rate may be greater than 35° C./minute, although much faster rates are also possible. In addition, the step of growing the first oxide portion may further comprise exposing the substrate 22 to an oxidizing ambient containing a relatively small amount of oxygen during the upward ramping to alternately or additionally reduce any oxide formed during upward ramping. For example, the relatively small amount of oxygen may be less than about 10%, although even smaller percentages may also be used. The step of upwardly ramping may also comprise upwardly ramping at the relatively high rate and in the ambient so that an oxide thickness formed during the upward ramping is in a range of about 5 to 30%, or less than about 30%, of the total thickness of the graded oxide layer. For example, for an oxide layer 30 thickness of about 50 Å, the initial or ramp portion of oxide may be 2–15 Å in thickness.

The total thickness of the graded oxide layer 30 may be less than about 50 Å for an ultrathin oxide, for example. The first temperature may be less than about 900° C., and the second temperature may be greater than about 925° C. (the SiO$_2$ viscoelastic temperature). More particularly, the first temperature may be in a range of about 750° C. to 900° C.; and the second temperature may be in a range of about 925° C. to 1100° C.

The first oxide portion 31 may further comprise an uppermost nitride portion, for example, not shown. The nitride portion serves to block dopant penetration in to the oxide layer 30 as will be readily understood by those skilled in the art. The growing steps may be carried out in a single processing apparatus in one embodiment of the invention. In another embodiment, the second oxide portion may be added to a pregrown or predeposited first oxide portion, for example. The single processing apparatus may be one of a furnace, a rapid thermal processor, and a fast thermal processor, for example. In addition, the semiconductor substrate 22 may include at least one channel region 25. Accordingly, in this embodiment, the graded oxide layer 30 is formed over the at least one channel region so that the graded oxide layer is a gate oxide layer.

The method produces an oxide layer having graded portions 31, 32 with greatly reduced stress, and substantially higher reliabilty, among other desirable properties. The ratio of the first and second portions can be controlled to produce an ultrathin oxide layer less than or equal to about 50 Å, for example.

Figure 2:
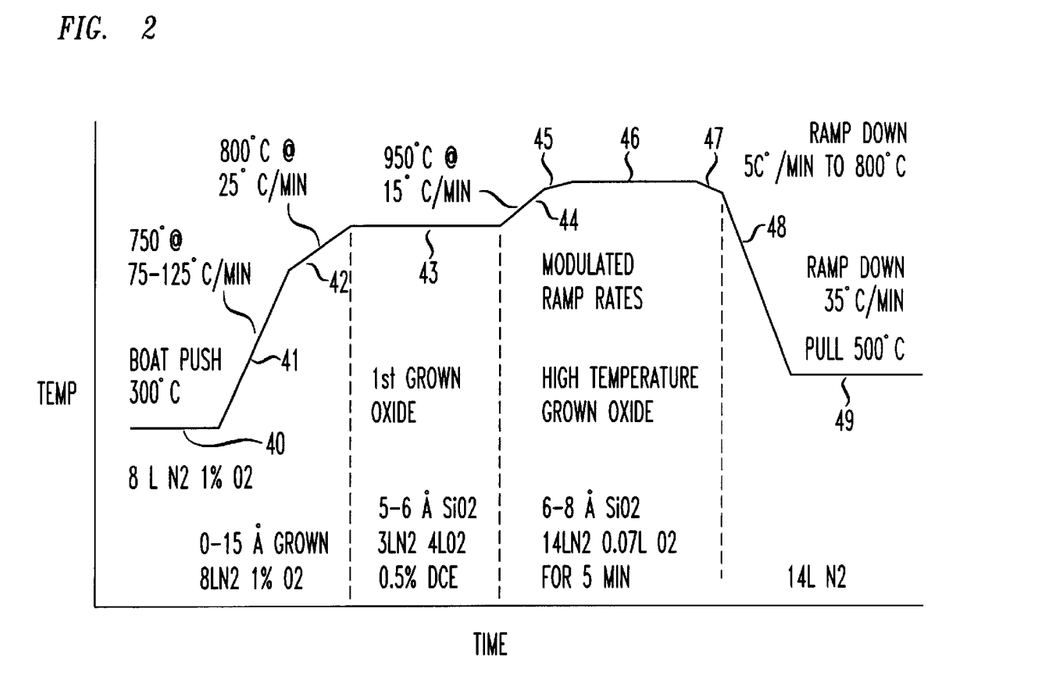
FIG. 2 is a graph of temperature versus time for growing the oxide layer in accordance with a first embodiment of the present invention.

Referring now more particularly to FIG. 2, one sequence for making a gate oxide layer 30 by fast thermal processing (FTP) is now described. Segment 40 indicates a wafer boat push step at a temperature of 300° C., a flow of nitrogen of 8 L and 0.1 to 1% oxygen. The same flows are maintained as the temperature is ramped upwardly at 75° C. o 125° C./minute to about 750° C. (segment 41), and then ramped more slowly at 25° C./minute to about 800° C. (segment 42) for better thermal stabilization.

Segment 43 has a nitrogen flow of 3 to 5 L, oxygen flow at 2 to 4 L, and dichloroethylene (DCE) is added at 0 to 0.5% for a time that is dependent upon the desired thickness as will be readily appreciated by those skilled in the art. For example, in segments 40–42 an oxide thickness in a range of 0–15 Å may be grown, and for the segment 43 about 5–6 Å of oxide may be grown.

Segment 44 is an upward temperature ramp to 950° C. at a rate of about 5–15° C./minute with a nitrogen flow of 14 L, and an oxygen flow of 0.07 L for about 5 minutes, for example. Segment 45 is a modulated upward ramp segment at about 5–10° C./minute to 1000° C. with the same flows as segment 44. The modulated heating at segment 45 is believed to reduce stress in the oxide 30. The temperature of 1000° C. is maintained at segment 46 in a 5 to 50% oxygen ambient for a desired time so that an additional 6–8 Å of oxide may be grown at the high temperature.

Segment 47 represents a temperature ramp down with a rate of about 3–5° C./minute to a temperature of about 800° C. with only a nitrogen flow of 14 L. The modulated cooling at the relatively slow rate downward to below the SiO$_2$ temperature is believed to further relieve stress in the oxide layer 30. Segment 48 represents a further ramp down at a faster rate of about 35° C./minute and segment 49 is the boat pull at about 500° C. with the nitrogen flow at 14 L.

Figure 3:
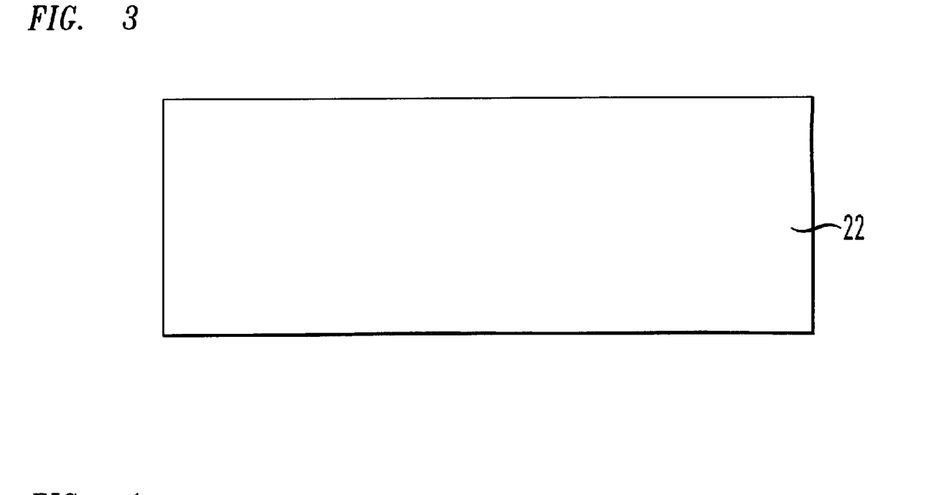
FIGS. 3–5 are schematic cross-sectional views illustrating making of the oxide layer in accordance with the present invention.
Figure 4:
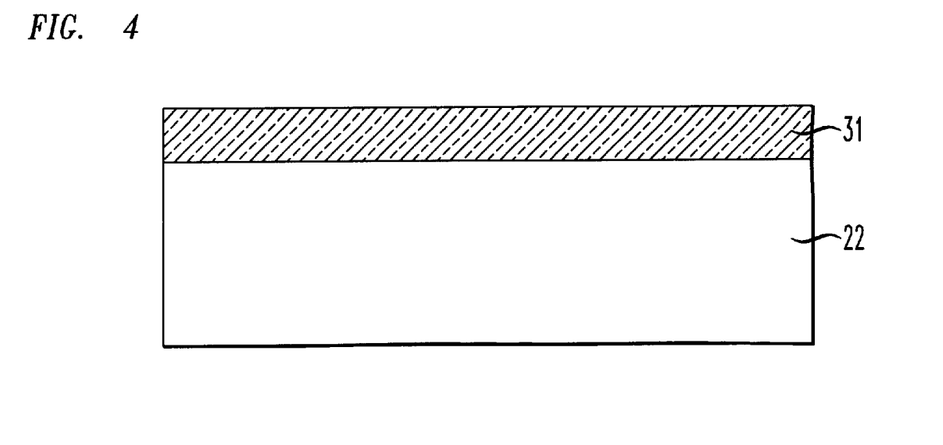

Referring now briefly to FIGS. 3–5, the steps of forming the oxide layer 30 are further illustrated. The substrate 22 (FIG. 3) is heated under the ambient conditions as mentioned above to produce the first oxide portion 31 as shown in FIG. 4. Continuing the heating and processing above the SiO$_2$ temperature as also described above produces the oxide layer 30 on the substrate 22 as shown in FIG. 5, and wherein the oxide layer includes first and second graded portions 31, 32. In particular, the first portion 31 may be considered the low temperature portion, that is, formed primarily below about 900° C. The second portion 32 may be considered the high temperature portion which is grown at a temperature of 925° C. to 1100° C. and which may have a thickness of 25–50% of the total thickness of the oxide layer 30. This second portion 32 provides a Si—SiO$_2$ interface 36 that is relatively planar and wherein the adjacent oxide and silicon portions are relatively stress free. Applicants theorize without wishing to be bound thereto that the formation of the first oxide portion 31 below the SiO$_2$ viscoelastic temperature, and the formation of the second portion 32 with the modulation of the heating and cooling near the upper temperature provides the stress relieved oxide layer 30.

Figure 6:
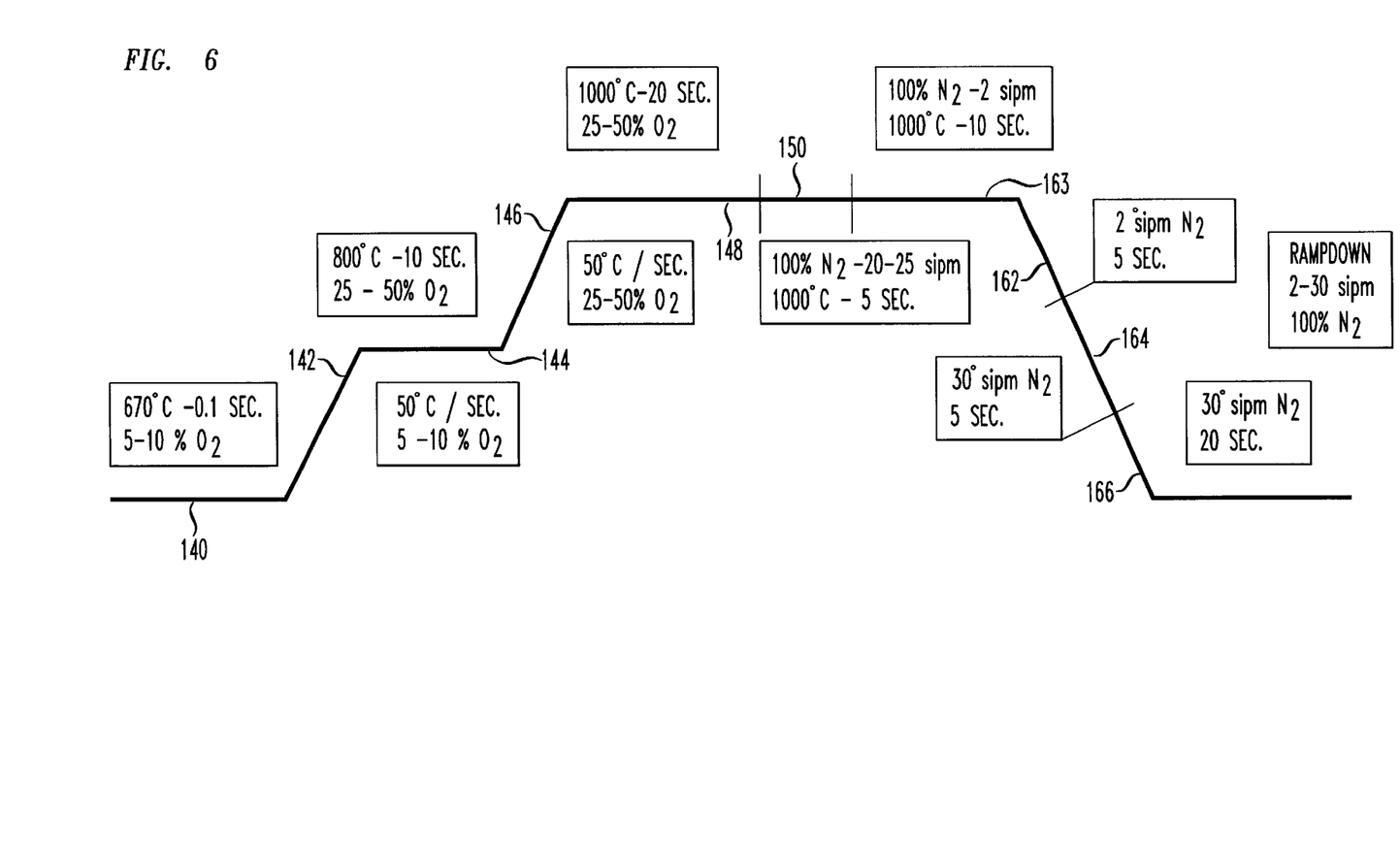
FIG. 6 is a graph of temperature versus time for growing the oxide layer in accordance with a second embodiment of the invention.

Turning now to FIG. 6, a rapid thermal processing (RTP) approach to forming the graded gate oxide layer 30 is now described. In the first horizontal segment 140, the temperature is 670° C. with a 5 to 10% oxygen ambient. Next, in the second segment 142, the temperature is rapidly ramped upward at 50° C./sec. in an ambient containing 5 to 10% oxygen. The first oxide portion 31 is grown primarily at the third segment 144 wherein the temperature is maintained at about 800° C. in a 25 to 50% oxygen ambient, for about 10 sec. A second upward ramp is performed at segment 146 at a rate of about 50° C./sec. to the temperature above the $SiO_2$ viscoelastic temperature at segment 148 and for a time of about 20 sec.

At segment 150 the substrate 22 and oxide layer 30 are subjected to a 100% nitrogen flow of 20 to 25 slpm for about 5 sec., then at segment 160 to a 100% nitrogen flow at a rate of about 2 slpm for about 10 sec. At segment 162 the temperature is ramped downward with a nitrogen flow of about 2 slpm for about 5 sec., then at 30 slpm for about 5 sec. at segment 164, and lastly at segment 166 for about 20 sec. at a 30 slpm flow rate. The temperature ramp down may be at greater than about 25° C./min., for example. Those of skill in the art will appreciate that these times, rates, and other parameters are illustrative of the invention only, and that other values may also be used.

Historically, thermal processing steps during wafer fabrication have been carried out in a furnace. A furnace relies on equilibrium heat transfer conditions to ensure uniform heating of wafers placed therein. This limits the rate of temperature rise in the furnace due to limitations governing uniform heat transfer across each wafer placed in the furnace. Rapid thermal processing (RTP), on the other hand, operates in an inherently transient mode where the various components of the reactor are not in thermal equilibrium with each other. RTP relies on the ability to heat the wafer fast enough that the heat transfer coupling is selective to the wafer relative to other reactor components. This calls for a cold wall reactor that has sufficient thermal mass (or cooling) such that the heat dissipation is limited and the reactor conditions remain constant over a period of time as will be readily appreciated by those skilled in the art.

Traditionally, difficulties in controlling the power coupling between the wafer and other reactor components, limiting the heat loss from the edge of the wafer, emissivity variations, and poor temperature sensing and control equipment have all limited RTP's ability to compete with furnaces on the basis of temperature uniformity and control, and stability. However, in recent years, improvements in temperature sensing, reactor design, and innovative pyrometry techniques which account for emissivity variations have established RTP as a viable alternative to all thermal processes that were once considered the domain of furnaces.

In order to combine the best features of furnaces and RTPs, the Fast Thermal Processor (FTP) has been developed. The FTP uses a standard vertical furnace configuration with a batch size of up to 100 wafers and enhanced heating and cooling capability to achieve ramp rates up to 100° C./min. Characteristic property of these furnaces equipped with the advanced heater element is that the surface load on the furnace walls is much higher than with metallic elements. This is due to the higher operating temperature of the heater element. The above reduces the heating time considerably. The wall loading is also dependent upon the placement of elements on the wall (along the walls or perpendicular thereto). This improved furnace hardware increases the ramp-up (heating) and ramp down (cooling) rates to reduce overall processing time and cost of ownership.

Both FTPs and RTPs have very good ambient temperature control resulting in minimum native oxide growth and slip dislocation generation during rapid ramp-up and ramp-down of the temperature. This is important for an ultrathin oxide (<50 Å) as the ramp oxide degrades electrical characteristics of the gate oxide and the silicon/oxide interface. For FTPs typically a ramp-up rate of 50–100° C./min. is used in a mildly oxidizing (0.05–0.5% O2) ambient during ramp-up to incur minimum (<10 Å) ramp oxide growth prior to the first oxidation step at 750–900° C. to grow about 50–75% of the total oxide thickness.

Thermal process sequence and ambient control by RTP are similar to that of FTP, except a ramp rate of 50–150° C./sec. is typically used on a single wafer rather in a batch. The final part of the synthesis involves growing the final oxide at a temperature above the $SiO_2$ viscoelastic temperature (about 925° C.) under the first grown layer in an oxidizing ambient of 5–50% oxygen to generate about 25–50% of the total gate oxide thickness, which is typically below about 50 Å. This concept of grading, however, is not limited to ultrathin gate oxides, but can also be used for gate oxides greater than about 50 Å and for interlevel oxides. For thicker oxides conventional furnaces can be used as ramp oxides plays a relatively minor role. Ramp down is done in an inert ambient typically 10–50° C./min for FTP and 10–50° C./sec for RTP. This graded grown oxide allows stress relaxation in the first grown layer while retaining an excellent silicon dioxide interface substructure formed at high temperature above the $SiO_2$ viscoelastic temperature.

Figure 7:
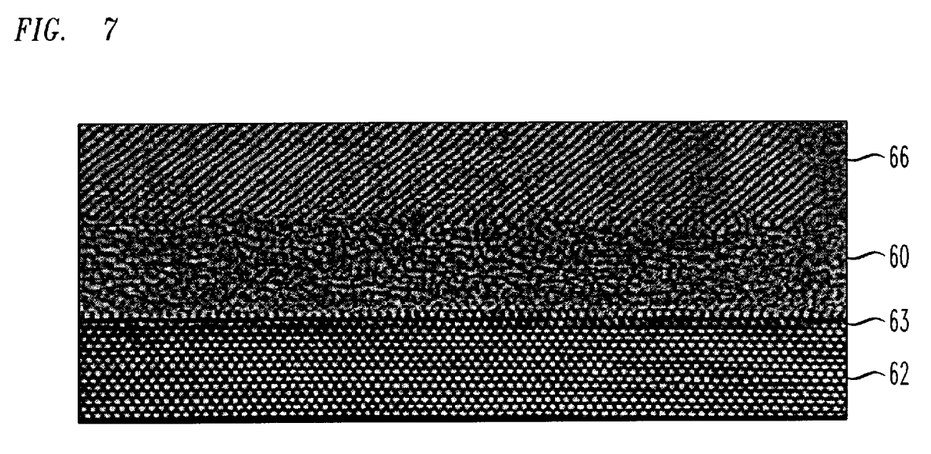
FIG. 7 is a transmission electron microscope (TEM) lattice image of a conventional oxide layer on a substrate and further including a conductive layer on the oxide as in the prior art.

Reliability problems for conventional gate oxide technology are increasingly important as gate oxide thickness are reduced below about 50 Å. New submicron technologies of 0.16 and 0.12 $\mu$m may require a gate oxide with a thickness below about 25 Å. Many believe that such relatively thin oxides present an insurmountable problem with existing technologies. However, the present invention overcomes the perceived difficulties primarily by addressing stress in the oxide and substrate adjacent the interface. For example, FIG. 7 is a TEM lattice image of a conventionally grown oxide 60 on a silicon substrate 62, and with a conductive polysilicon gate layer 56 on the oxide. A stress band 63 (dark contrast) is clearly evident in the crystalline lattice of the silicon substrate 62 at the interface region. Stress also exists in the oxide layer 60; however, the stress band is not visible using the TEM image since the oxide layer 60 is amorphous as will be readily appreciated by those skilled in the art. In addition, the $SiO_2$ interface is relatively rough as will be seen with subsequent comparison to the oxide layer 30 of the present invention.

In general, Applicants theorize that the stress is due to a mismatch of expansion coefficients which are fixed for a particular oxidation temperature (Tox). The stress generated due to the growth condition is a net result of two competing processes: (1) a decrease in viscosity of the $SiO_2$ with an increase in Tox above the $SiO_2$ viscoelastic temperature (Tc), and (2) structural relaxation that increases the viscosity. In accordance with one aspect of the present invention modulating the ramp rate near Tc thereby relaxes the stress on a pre-grown $SiO_2$ portion 31.

Figure 8:
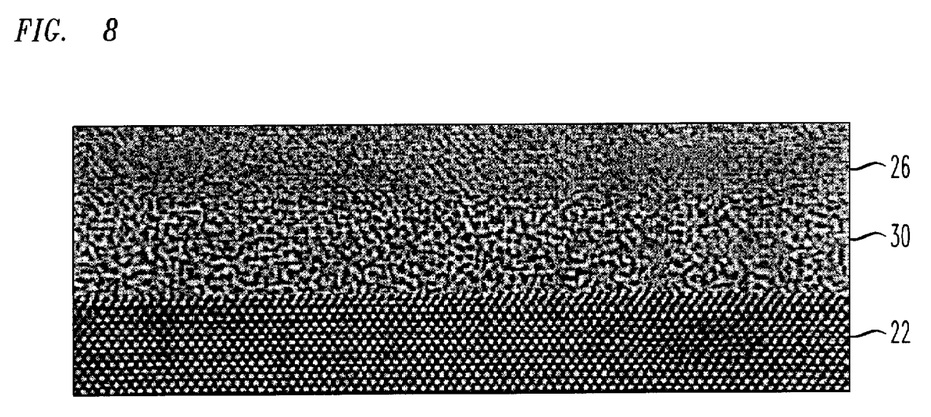
FIG. 8 is a transmission electron microscope (TEM) lattice image of an oxide layer on a substrate and further including a conductive layer on the oxide in accordance with the present invention.

Preliminary carrier concentration profiling under the channel of relevant dopants (Phosphorous and Boron) indicated that the present invention does not change the threshold voltage for a MOSFET compared to conventional processing sequences. More particularly, as shown in the TEM lattice image of FIG. 8, there is no stress band (dark contrast) as in the conventionally grown oxide as shown in FIG. 7. Instead the interface between the oxide layer 30 and the silicon substrate 22 is substantially stress free. The oxide portions 31, 32 are also substantially stress free. In addition, the interface is also substantially planar with a planarity that can typically be less than about 3 Å stress measurements performed on the oxide fabricated by the method of the present invention indicate virtually no detectable compression or tension. To this end, using conventional methods such as X-ray microdiffraction the Si <400> Bragg peak profile indicates $1.0 \times 10^9$ dynes/cm$^2$ or less of compression; whereas conventional oxides exhibit $9 \times 10^9$ to $1 \times 10^{10}$ dynes/cm$^2$ of tension.

Although the two graded portions 31, 32 are not visible in the amorphous oxide layer 30, those of skill in the art will recognize that other conventional analysis tools may be used to detect the two different portions. For example, backscattering techniques may be used to detect the two graded portions 31, 32 of the oxide layer 30.

Figure 9:
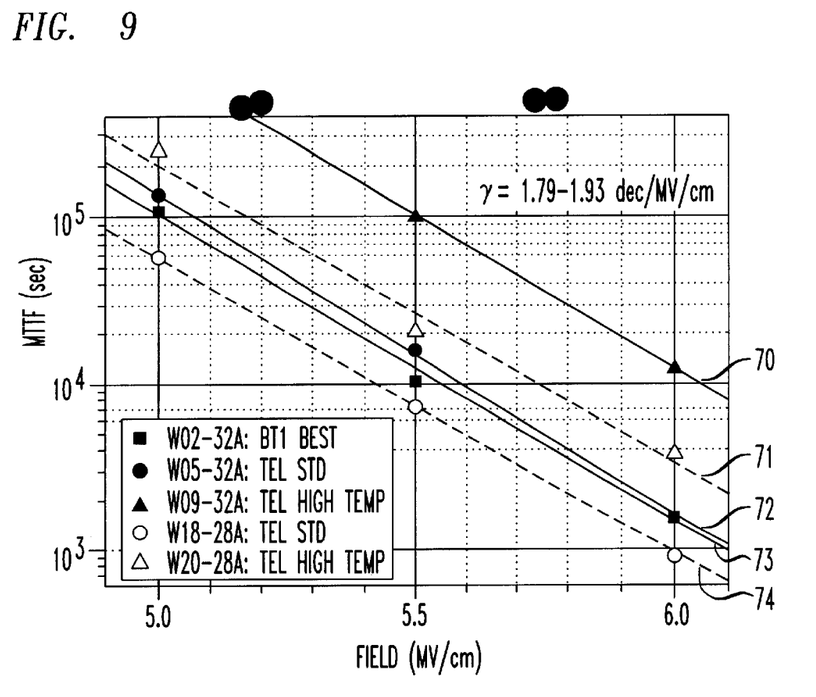
FIG. 9 is a graph including plots of mean time to failure (MTTF) versus electric field strength for conventional oxide layers and oxide layers in accordance with the present invention.

The oxide layer 30 has a number of desirable properties as will now be discussed in further detail. For example, the oxide 30 has a factor of 8–10 improvement in TDDB as will be understood with reference to FIG. 9. In particular, the plot of MTTF versus electric field strength is plotted for various conventional oxides and oxides in accordance with the present invention using 0.25 $\mu$m CMOS processes. The plot 70 is for an oxide 30 of the invention having a thickness of 32 Å, while corresponding conventional oxides of similar thickness are represented by plots 72 and 73. Plot 71 is for an oxide layer 30 of 28 A in accordance with the invention and compares to a conventional oxide of 28 A represented by plot 74. Those of skill in the art will appreciated the long term reliability improvement provided by the present invention.

Figure 10:
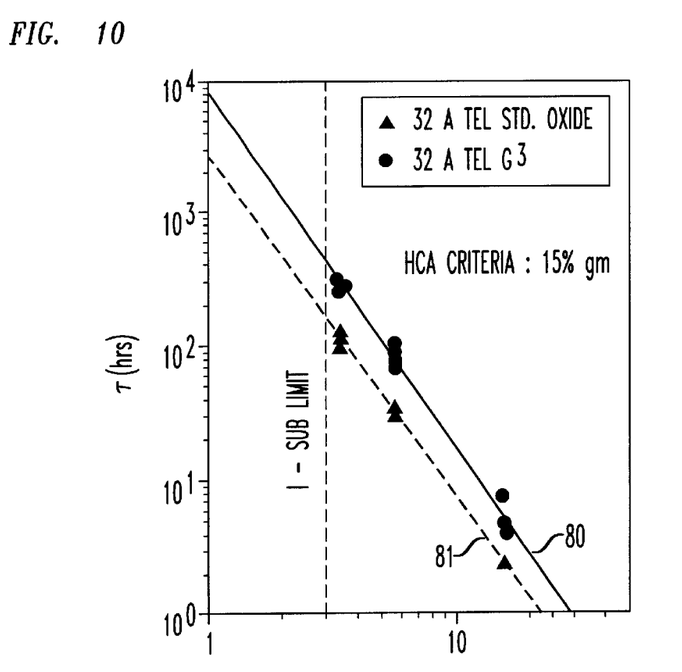
FIG. 10 is a graph including plots of time versus $I_{sub}$ indicative of hot carrier aging (HCA) for a conventional oxide layer and an oxide layer in accordance with the present invention.

Turning now to FIG. 10, an improvement in hot carrier aging (HCA) is now explained. The HCA criteria is a 15% change in transconductance (gm). More particularly, the time is plotted versus $I_{sub}$. The plot labeled 80 is for a 32 Å thick oxide layer 30 in accordance with the invention. The plot labeled 81 is for a conventional oxide of similar thickness. As will be readily appreciated by those skilled in the art, the HCA is improved by a factor of 5–10 for the present invention.

Figure 11:
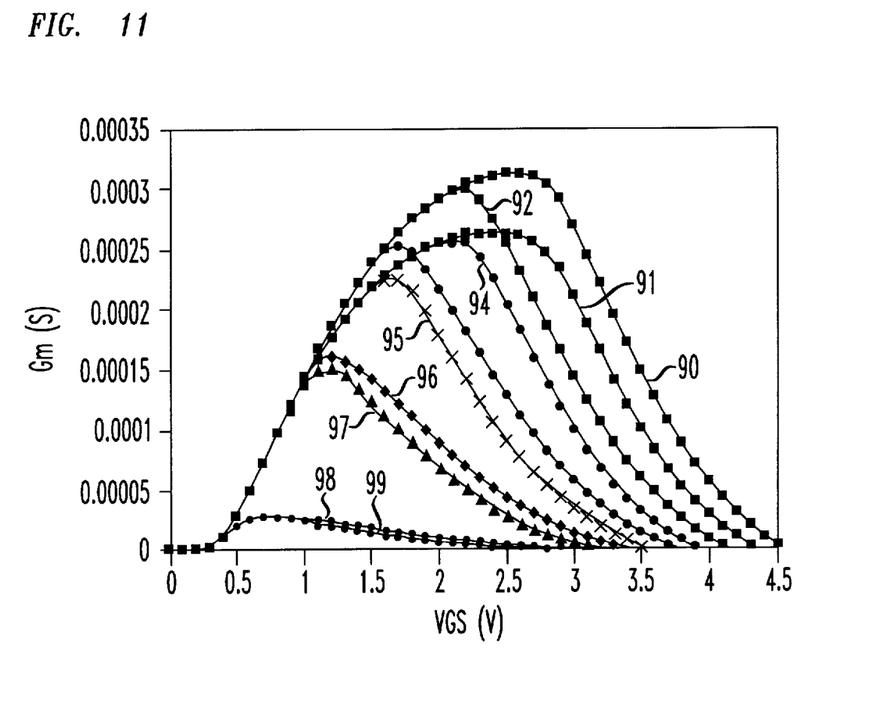
FIG. 11 is a graph including plots of transconductance versus gate-source voltage for 15×15 $\mu m^2$ NMOS FETs including conventional gate oxide layers and gate oxide layers in accordance with the present invention.

As shown in FIG. 11, channel mobility is also increased in accordance with another advantage of the present invention. The even numbered plots are for the gate oxide layer 30 of the present invention, while the odd numbered plots are for conventional gate oxides. The transconductance values versus gate-source voltage are plotted for 15×15 $\mu$m2 NMOS FETs. Plots 90 and 91 are for a drain voltage of 2.1 volts and for the oxide of the invention and the conventional oxide, respectively. Similarly, plots 92 and 93 are for a drain voltage of 1.6 volts for the oxide of the invention and the conventional oxide, respectively. Plots 94 and 95 are for a drain voltage of 1.1 volts for the oxide of the invention and the conventional oxide, respectively. Plots 96 and 97 are for a drain voltage of 0.6 volts for the oxide of the invention and the conventional oxide, respectively. Lastly, plots 98 and 99 are for a drain voltage of 0.1 volts for the oxide of the invention and the conventional oxide, respectively. As will be readily appreciated by those skilled in the art, the oxide layer 30 in accordance with the invention provides a 5–6% increase in channel mobility compared to a conventional oxide.

Figure 12:
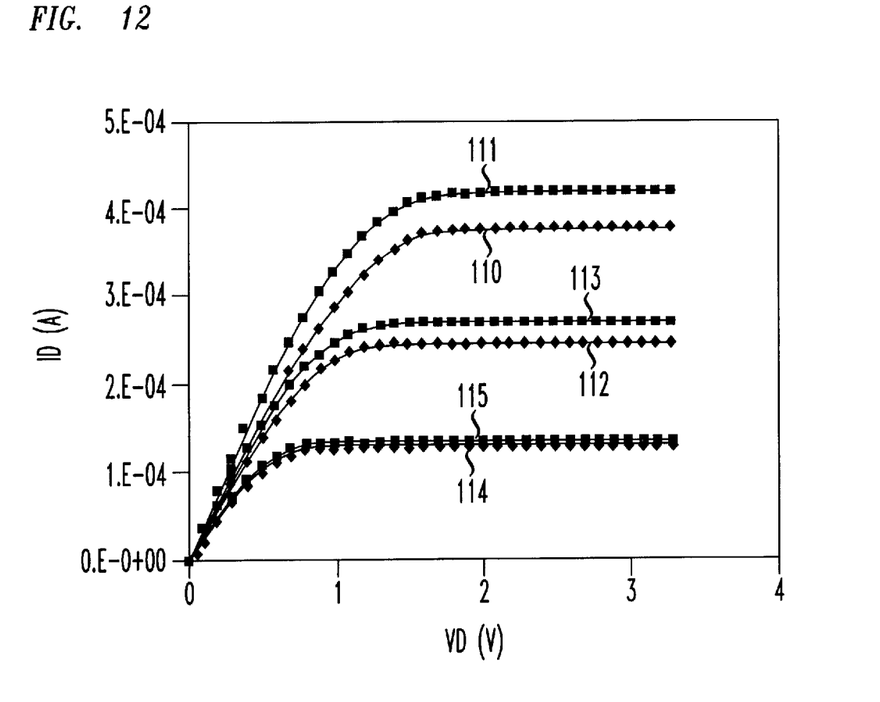
FIG. 12 is a graph including plots of drain current versus drain voltage for 15×15 $\mu m^2$ NMOS FETs including conventional gate oxide layers and gate oxide layers in accordance with the present invention.

FIG. 12 provides comparative results for the oxide layer 30 of the invention and a conventional oxide relating to drive current for 15×15 $\mu$m2 NMOS FETs. The drain current is plotted versus drain voltage for a series of gate voltages. Plots 110 and 111 are for a gate voltage of 2.5 volts for the oxide layer 30 of the invention and a conventional oxide, respectively. Similarly, plots 112 and 113 are for a gate voltage of 2.0 volts for the oxide layer 30 of the invention and a conventional oxide, respectively. Plots 114 and 115 are for a gate voltage of 1.5 volts for the oxide layer 30 of the invention and a conventional oxide, respectively.

Figure 13:
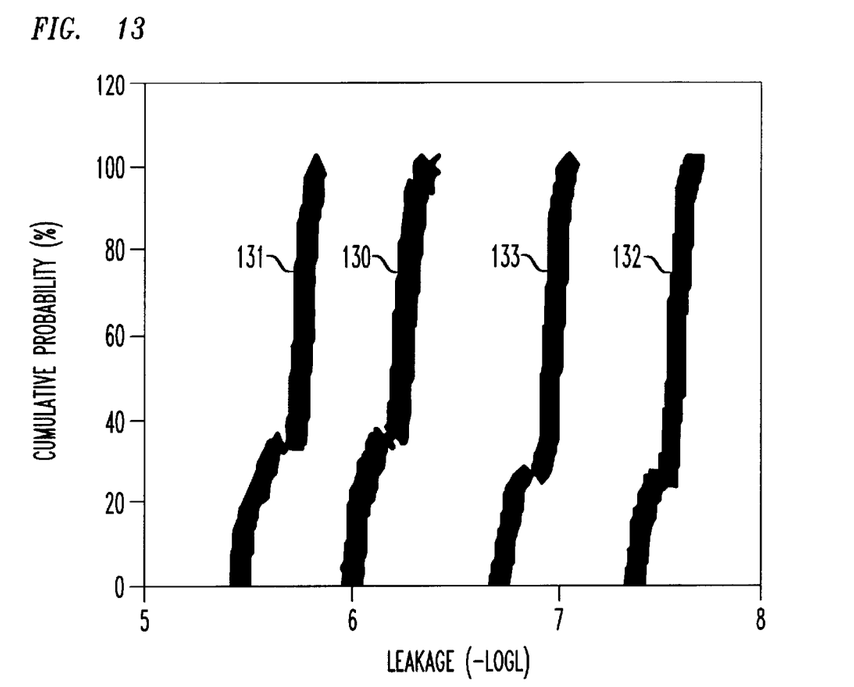
FIG. 13 is a graph including plots of cumulative probability versus leakage for 15×15 $\mu m^2$ FETs in an n-type tub including conventional gate oxide layers and gate oxide layers in accordance with the present invention.
Figure 14:
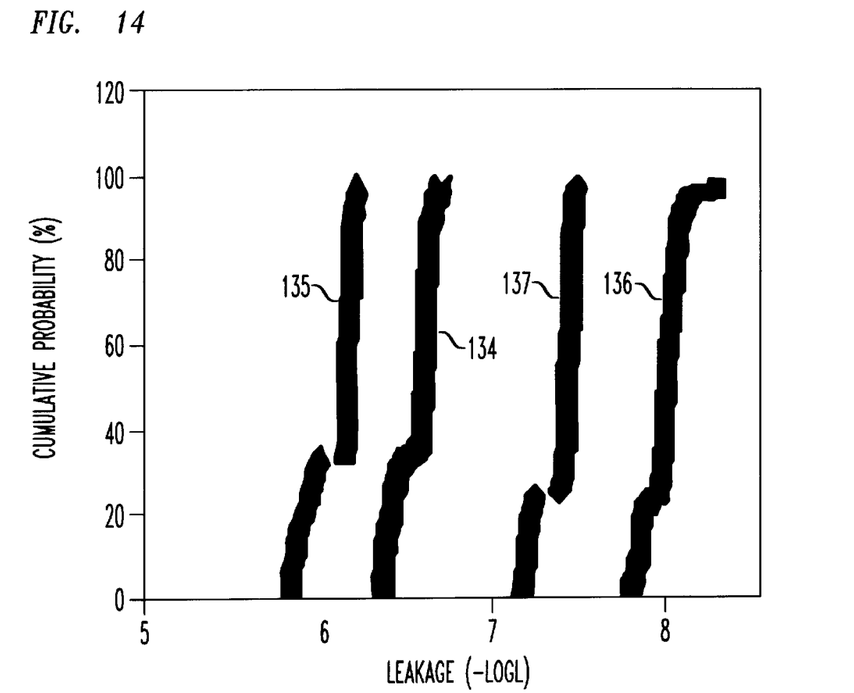
FIG. 14 is a graph including plots of cumulative probability versus leakage for 15×15 $\mu m^2$ FETs in a p-type tub including conventional gate oxide layers and gate oxide layers in accordance with the present invention.

The leakage current characteristics for a transistor are also improved using the oxide layer 30 in accordance with the present invention as explained further with reference to FIGS. 13 and 14. FIG. 13 is a graph of commutative probability versus leakage current for gate oxides in an N type tub at a voltage of 2.0 volts. Plot 130 is for a gate oxide layer 30 in accordance with the invention having a thickness of 28 Å, and plot 131 is for a conventional oxide of the same thickness. Plot 132 is for an oxide layer 30 of the invention having a thickness of 32 Å, while plot 133 is for a conventional oxide layer of 32 Å.

FIG. 14 also presents various leakage plots, but for a P type tub at a voltage of 2.0 volts. Plot 134 is for a gate oxide layer 30 in accordance with the invention having a thickness of 28 Å, and plot 135 is for a conventional oxide of the same thickness. Plot 136 is for an oxide layer 30 of the invention having a thickness of 32 Å, while plot 137 is for a conventional oxide layer of 32 Å. Again, the oxide layer 30 of the invention offers an 8–10 improvement in leakage current.

As noted below in TABLE 1, the oxide layer 30 of the present invention when used as a gate oxide offers significant advantages in drive current, leakage and mobility. In the table the oxide of the invention is indicated by G3, and the conventional oxides by CONV.

TABLE 1

Comparative Transistor Characteristics of NMOS Devices (15 × 15 (m2)

| Oxide | Tox (Å) | Vt (V) | Ion (mA) | -Log (Ioff) | Mobility (a.u.) |
|---|---|---|---|---|---|
| G3 | 39.9 | 0.45 | .067 | 11.3 | 287.4 |
| Conv. | 38.8 | 0.45 | 0.58 | 11.4 | 274.8 |
| G3 | 36.2 | 0.42 | 0.71 | 11.2 | 306.1 |
| Conv. | 35.5 | 0.43 | 0.60 | 11.1 | 293.5 |

The present invention also has significant advantages in TDDB and HCA as explained in detail above. The process in accordance with the invention also has excellent manufacturability as will be appreciated with reference to TABLE 2 below which gives passive data collection results.

TABLE 2

Passive Data Collection Results

| Parameter | | Parameter | Å | Parameter | % |
|---|---|---|---|---|---|
| Within Wafer Var. | 0.06 | Within Wafer StDev. | 0.24 | Percent StDev. (wiw) | 0.87 |
| Wafer to Wafer Var. | 0.00 | Wafer-to-Wafer StDev. | 0.00 | Percent StDev. (wtw) | 0.00 |
| Run-to-Run Var. | 0.06 | Run-to-Run StDev. | 0.25 | Percent StDev (rtr) | 0.88 |
| # Sites/Wafer | 13 | Upper Spec. | 30 | Up. Cpk | 1.79 |
| # Wafers/Run | 5 | Lower Spec. | 26 | Lwr. Cpk | 2.05 |
| Total Var. | 0.12 | Cp | 1.92 | | |
| Total StDev. | 0.35 | Cpk | 1.79 | | |
| All Points Range | 2.4 | Mean Thk. | 28.1 | | |

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. A method for making a graded oxide layer on a silicon substrate comprising the steps of:

growing a first oxide portion by upwardly ramping the silicon substrate, in the presence of oxygen and at a ramping rate sufficient to minimize oxide formation during the upward ramping, to a first temperature lower than a $SiO_2$ viscoelastic temperature, and exposing the silicon substrate to an oxidizing ambient at the first temperature and for a first time period; and growing a second oxide portion between the first oxide portion and the silicon substrate by exposing the silicon substrate to an oxidizing ambient at a second temperature higher than the $SiO_2$ viscoelastic temperature for a second time period so that the second oxide portion has a thickness in a range of about 25 to 50% of a total thickness of the graded oxide layer.

2. A method according to claim 1 wherein the ramping rate is greater than about 35° C./minute.

3. A method according to claim 1 wherein the amount of oxygen present is less than about 10%.

4. A method according to claim 1 wherein the step of upwardly ramping comprises upwardly ramping at a relatively high rate and in an ambient so that an oxide thickness formed during the upward ramping is in a range of about 5 to 30% of the total thickness of the graded oxide layer.

5. A method according to claim 1 wherein the total thickness of the graded oxide layer is less than about 50 Å.

6. A method according to claim 1 wherein the first temperature is less than about 900° C.; and wherein the second temperature is greater than about 925° C.

7. A method according to claim 1 wherein the first temperature is in a range of about 750° C. to 900° C.; and wherein the second temperature is in a range of about 925° C. to 1100° C.

8. A method according to claim 1 further comprising the step of forming a nitride portion of the first oxide portion.

9. A method according to claim 1 wherein the growing steps are carried out in a single processing apparatus.

10. A method according to claim 9 wherein the single processing apparatus comprises one of a furnace, a rapid thermal processor, and a fast thermal processor.

11. A method according to claim 1 wherein the semiconductor substrate includes at least one channel region; and wherein the graded oxide layer is formed over the at least one channel region so that the graded oxide layer is a gate oxide layer.

12. A method for making a graded oxide layer on a silicon substrate comprising:

growing a first oxide portion by;

upwardly ramping the silicon substrate at a relatively high rate to a first temperature lower than a $SiO_2$ viscoelastic temperature and in an ambient having oxygen so that any oxide formed during the upward ramping is minimized to less than about 30% of a total thickness of the graded oxide layer, and exposing the silicon substrate to an oxidizing ambient at the first temperature and for a first time period; and growing a second oxide portion between the first oxide portion and the silicon substrate by exposing the silicon substrate to an oxidizing ambient at a second temperature higher than the $SiO_2$ viscoelastic temperature for a second time period.

13. A method according to claim 12 wherein the step of growing the second oxide portion comprises growing the second oxide portion to have a thickness in a range of about 25 to 50% of the total thickness of the graded oxide layer.

14. A method according to claim 12 wherein the total thickness of the graded oxide layer is less than about 50 Å.

15. A method according to claim 12 wherein the first temperature is less than about 900° C.; and wherein the second temperature is greater than about 925° C.

16. A method according to claim 12 wherein the first temperature is in a range of about 750° C. to 900° C.; and wherein the second temperature is in a range of about 925° C. to 1100° C.

17. A method according to claim 12 further comprising the step of forming a nitride portion of the first oxide portion.

18. A method according to claim 12 wherein the growing steps are carried out in a single processing apparatus.

19. A method according to claim 18 wherein the single processing apparatus comprises one of a furnace, a rapid thermal processor, and a fast thermal processor.

20. A method according to claim 12 wherein the semiconductor substrate includes at least one channel region; and wherein the graded oxide layer is formed over the at least one channel region so that the graded oxide layer is a gate oxide layer.

21. A method for making a graded oxide layer, comprising:

providing a silicon substrate including a first oxide portion thereon formed by upwardly ramping the silicon substrate, in the presence of oxygen and at a ramping rate sufficient to minimize oxide formation during the upward ramping, to a first temperature, and exposing the silicon substrate to an oxidizing ambient at the first temperature and for a first time period; and growing a second oxide portion between the first oxide portion and the silicon substrate by exposing the silicon substrate to an oxidizing ambient at a second temperature higher than the $SiO_2$ viscoelastic temperature for a second time period so that the second oxide portion has a thickness in a range of about 25 to 50% of a total thickness of the graded oxide layer.

22. A method according to claim 21 wherein the total thickness of the graded oxide layer is less than about 50 Å.

23. A method according to claim 21 wherein the first temperature is less than about 900° C.; and wherein the second temperature is greater than about 925° C.

24. A method according to claim 21 wherein the first temperature is in a range of about 750° C. to 900° C.; and wherein the second temperature is in a range of about 925° C. to 1100° C.

25. A method according to claim 21 wherein the first oxide portion comprises a nitride portion.

26. A method according to claim 21 wherein the growing steps are carried out in a single processing apparatus.

27. A method according to claim 26 wherein the single processing apparatus comprises one of a furnace, a rapid thermal processor, and a fast thermal processor.

28. A method according to claim 21 wherein the semiconductor substrate includes at least one channel region; and wherein the graded oxide layer is formed over the at least one channel region so that the graded oxide layer is a gate oxide layer.

29. A method of fabricating an oxide having a thickness, the method comprising:

upwardly ramping a substrate to a first temperature, in the presence of oxygen and at a ramping rate sufficient to minimize oxide formation during the upward ramping, and exposing said substrate to an oxidizing ambient to form a first oxide portion; and exposing said substrate to a second oxidizing ambient at a second temperature to form a second oxide portion.

30. A method as recited in claim 29, wherein said second oxide portion is between said substrate and said first oxide portion.

31. A method as recited in claim 29, wherein said second oxide portion has a thickness in the range of approximately 25% to 50% of the thickness of the oxide.

32. A method as recited in claim 29, wherein said first temperature is less than a $SiO_2$ viscoelastic temperature.

33. A method as recited in claim 29, wherein said second temperature is greater than a $SiO_2$ viscoelastic temperature.

* * * * *